(12) United States Patent
Li et al.

(10) Patent No.: US 6,521,486 B1
(45) Date of Patent: Feb. 18, 2003

(54) METHOD AND SYSTEM TO REDUCE SWITCHING SIGNAL NOISE ON A DEVICE AND A DEVICE AS RESULT THEREOF

(75) Inventors: Xia Li, Fremont, CA (US); Reid Hirata, Santa Clara, CA (US); Michael Coiner, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/645,923

(22) Filed: Aug. 24, 2000

(51) Int. Cl.[7] .................... H01L 21/44; H01L 21/48; H01L 21/50; H01L 21/66; G01R 31/26
(52) U.S. Cl. .................... 438/118; 438/18; 438/126
(58) Field of Search .................... 438/109, 119, 438/118, 126, 997, 18

(56) References Cited

U.S. PATENT DOCUMENTS

| | | | | |
|---|---|---|---|---|
| 4,646,119 A | * | 2/1987 | Kosonocky | ................ 257/239 |
| 5,095,402 A | * | 3/1992 | Hernandez et al. | ......... 257/691 |
| 5,564,617 A | * | 10/1996 | Degani et al. | ......... 228/180.22 |
| 5,598,033 A | * | 1/1997 | Behlen et al. | ............... 257/686 |
| 5,724,729 A | * | 3/1998 | Sherif et al. | ................ 257/707 |

* cited by examiner

Primary Examiner—Wael Fabury
Assistant Examiner—William M. Brewster
(74) Attorney, Agent, or Firm—Sawyer Law Group LLP

(57) ABSTRACT

A method, and system for reducing switching noise on a device, and an improved capacitor-integrated device is disclosed. At least one conductive line is deposited within a device. Additionally, at least one capacitor is attached to the at least one conductive line. Once the capacitor is attached to the conductive line, an improved capacitor-integrated circuit device results. The method and system of the present invention provides for the addition of at least one capacitor to be added between the power supply pins on at least one IC device. By doing so, switching signal noise is reduced. As a result of the method and system of the present invention, the resulting improved device can be efficiently used to check various qualities such as the level of ground bouncing noise, or switching signal noise reduction, without changing the circuit design of the device.

31 Claims, 4 Drawing Sheets

METHOD AND SYSTEM TO REDUCE SWITCHING SIGNAL NOISE ON A DEVICE AND A DEVICE AS RESULT THEREOF

FIELD OF THE INVENTION

The present invention relates generally to integrated circuit (IC) devices, and more particularly to reducing the level of switching signal noise on such devices.

BACKGROUND OF THE INVENTION

Integrated circuit (IC) devices frequently suffer from the problem of switching signal noise. It is generally known that in order to alleviate the problem of switching signal noise, the addition of a decoupling capacitor between the power supply pins on an IC device will reduce the ground bounce that occurs due to switching signal noise on IC devices.

One conventional approach which attempts to resolve the problem involves the process of adding a capacitor on the outside of packaged IC devices. However, a major shortcoming of this conventional method is that in some cases, the switching signal noise is not detectable at the package level. In other words, noise can not be detected through the lead frame pins (or solder connection balls for Ball Grid Array (BGA) packages), therefore, the device cannot be effectively tested.

In another conventional approach, the addition of a decoupling capacitor is achieved by fabricating a transistor type capacitor within the circuitry of the device. However, this requires the modification, or re-fabrication of the circuit design. Therefore, this method is undesirable since it requires unduly expenditure of the time and expense associated with the re-fabrication of the circuit design.

Accordingly, what is needed is an efficient and effective method and system for reducing switching signal noise that allows one to determine the effect of an added capacitor(s). The resulting device should allow testing for various qualities such as the level of ground bounce noise, and/or the level of switching signal noise. Further, it should not be necessary to re-fabricate the device in order to achieve the above. Such a method, system, and device should allow for an efficient, and effective way to reduce the level of switching signal noise in the device. Further, such a method, system, and device should improve efficiency, and reduce the cost of manufacturing. The present invention addresses such a need.

SUMMARY OF THE INVENTION

In accordance with the present invention, an improved method, and system for minimizing switching signal noise on a device is disclosed which results in an improved device. At least one conductive line is deposited within a device. Additionally, at least one capacitor is attached to the at least one conductive line within the device. An improved capacitor-integrated circuit device can result from the improved method and system described herein.

Accordingly, the method, system, and device of the present invention overcomes the problems of conventional approaches by describing the addition of at least one chip-scale capacitor on a device which reduces the problem of switching signal noise. By adding a chip-scale capacitor between the power supply pins on the device, the problem of switching signal noise can be alleviated, and the device can be tested for ground bouncing noise without going through the process of changing device circuit designs.

Therefore, the problems, inconvenience, and expense associated with adding actual integrated capacitors into the circuits and re-fabrication of the devices are overcome by the present invention.

DETAILED DESCRIPTION

A method, and system is described for reducing the level of switching noise on a device which results in an improved capacitor-integrated circuit device. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The method and system of the present invention provides for the depositing of at least one conductive line within at least one IC device allowing at least one chip-scale capacitor to be added between the power supply pins on the IC device. By doing so, switching signal noise is reduced. As a result of the method and system of the present invention, the resulting improved device can be efficiently used to check various qualities such as the level of ground bouncing noise, or switching signal noise reduction, without changing the circuit design of the device.

It should be understood that although the present invention is being described in an embodiment in the context of a method and system which decapsulates a chipset device which is packaged in a Plastic Ball Grid Array (PBGA) package, one of ordinary skill in the art readily recognizes that the principles described herein could apply to devices packaged in other ways, such as a Fine Ball Grid Array (FBGA), or other Ball Grid Array (BGA) packages, or to devices which are not packaged, and the use would be within the spirit and scope of the present invention. Specifically, the method and system in accordance with the present invention could be utilized with a number of different types of devices which may be composed of different materials, with devices packaged in other ways, and with other viable methods of decapsulation, and the principals of the system and method would be within the spirit and scope of the present invention.

Figure 1:
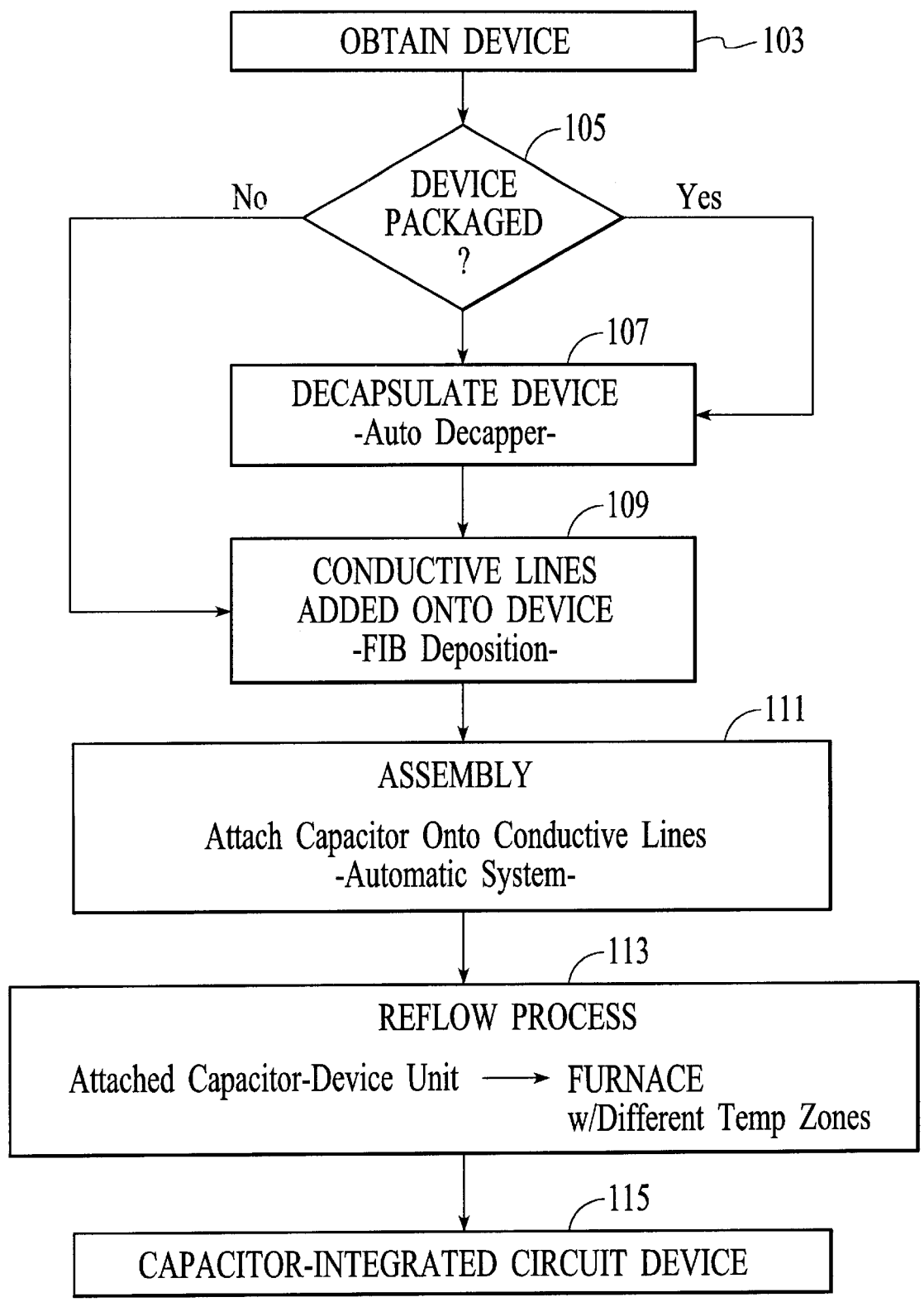
FIG. 1 is a flow chart illustrating the method, system, and the resulting device of the present invention.

To more particularly describe the present invention, refer now to the following description in conjunction with the accompanying figures. FIG. 1 is a flow chart illustrating the method, system, and resulting device in accordance with the present invention. As shown in FIG. 1, a device is first obtained via step 103. Next, it is determined whether the device is packaged or not via step 105. If the device is packaged, the device is subjected to a decapsulation process via step 107 which exposes the silicon die. If however, the device is not packaged, decapsulation is not necessary. Next, via step 109 conductive lines may be added onto the device preferably utilizing a Focused Ion Beam (FIB) process. An assembly process then occurs via step 111 in which a capacitor is attached onto the conductive lines, and a capacitor-integrated circuit device unit is formed. A reflow process may preferably be utilized via step 113 to enhance the electrical connection producing the unit which is provided via step 115.

Figure 3:
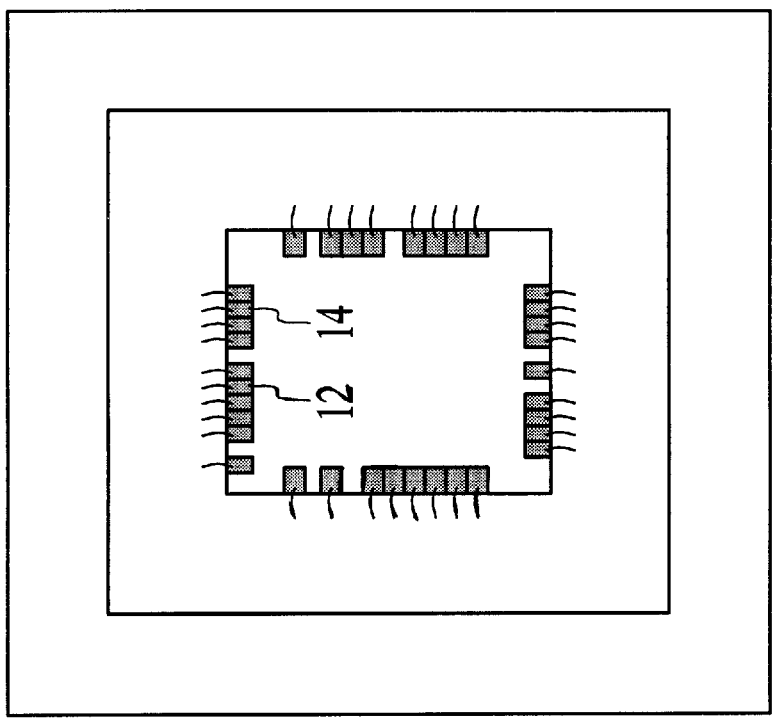
FIG. 3 is a top view illustrating an exposed die after package decapsulation in accordance with the system and method of the present invention.
Figure 2:
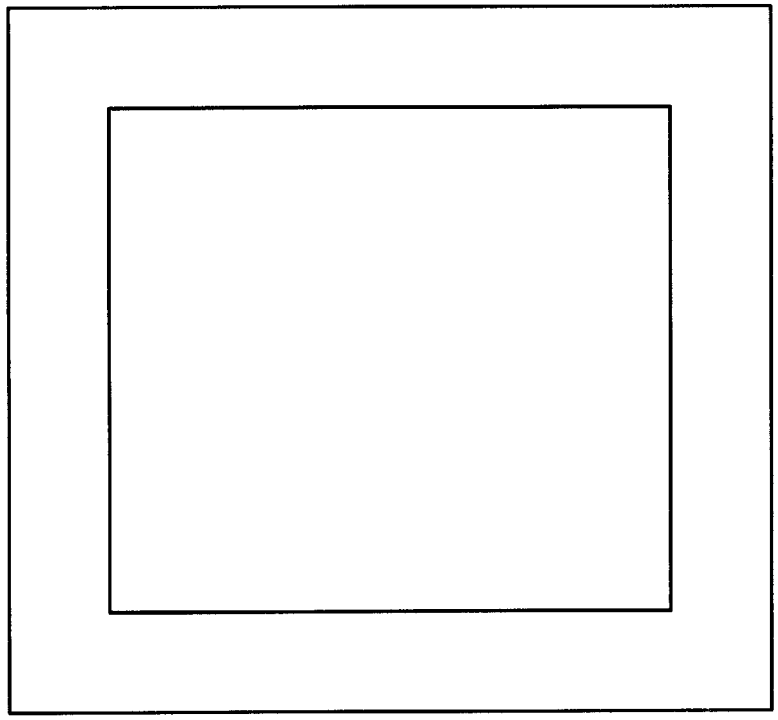
FIG. 2 is a top view illustrating a PBGA packaged device before decapsulation in the prior art.

Referring now to FIG. 2, a top view of a chipset device 100 is illustrated in a standard PGBA package. Referring to FIG. 3, in a preferred embodiment, the packaged device 100 is chemically decapsulated to expose the silicon die 10 utilizing an automatic decapsulator, such as the Auto Decapper (not shown) in conjunction with fuming Sulfuric acid (H2SO4) at optimal parameters. In a preferred embodiment, H2SO4 is utilized, and the automatic decapsulation process utilizes a B & G Model 250 Automatic Decapsulator/Auto Decapper, but one of ordinary skill in the art recognizes that HNO3 could be used in the decapsulation process instead of H2SO4, or a mixture of HNO3 and H2SO4 could be utilized, and other automatic decappers could also be used. In a preferred embodiment, the temperature is approximately 240 degrees Celsius, and the etch time for decapsulation is approximately 300 seconds depending on the size of the device, and the size of the package. It is critical to completely remove the plastic packaging compound from the bond pads 12 and 14 of the silicon die 10 where conductive metal lines will be deposited as described later.

Figures 4, 5:
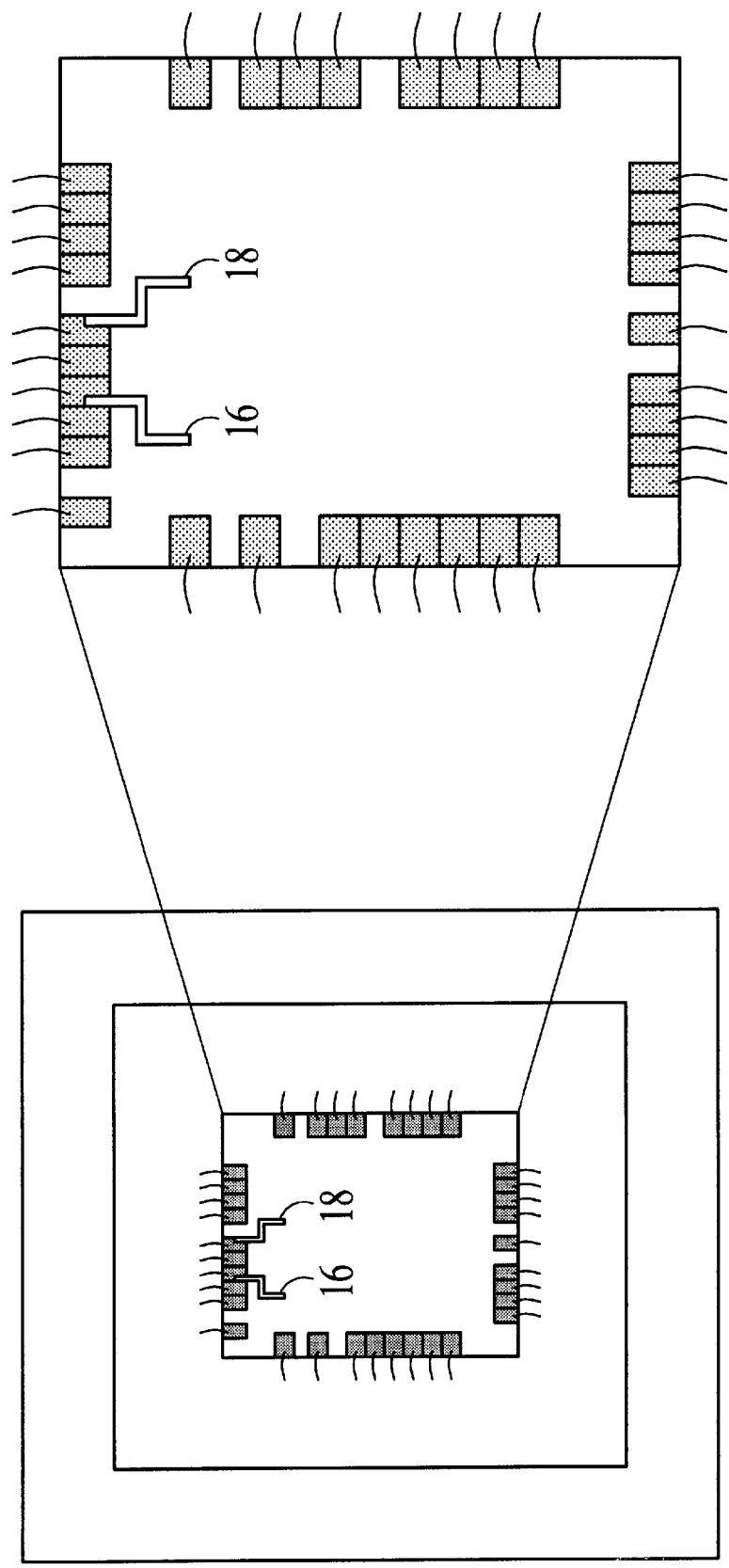
FIG. 4 is top view illustrating deposited conductive lines that extend from the bond pads of a power supply to the open areas of the die in accordance with the present invention.
FIG. 5 is a zoom-in top view illustrating a die after deposited conductive lines have been added in accordance with the present invention.

Referring to FIGS. 4 and 5, two conductive metal lines 16 and 18 are deposited onto the die 10 utilizing a Focused Ion Beam (FIB) process. The FIB process is a commonly used tool for IC circuit repairs by performing metal cutting or depositing. Due to its high resolution (0.2 um), the FIB process is used to access sub-micron features at different metal layers, and to add as long as thousands micron of long lines for new connections. FIB deposited lines have been used to bring signals or power supplies from one location to another on IC devices. However, in the present invention the FIB process is being utilized to deposit conductive metal lines having a resistance as low as 10 ohm per square which will be capable of providing proper electrical connections.

The conductive lines 16 and 18 are deposited to extend from the power supply bond pads 12 and 14 to the open area 20 of the die surface. The conductive lines 16 and 18 are then capable of bringing a power supply voltage, for example VDD (approximately 3 volts), and Ground (0 volts), to the open area 20 of the die surface. The lines 16 and 18 are deposited in such a shape that a capacitor that is of a chip-scale, can be attached to the ends of lines 16 and 18 for connections.

Figures 6, 7:
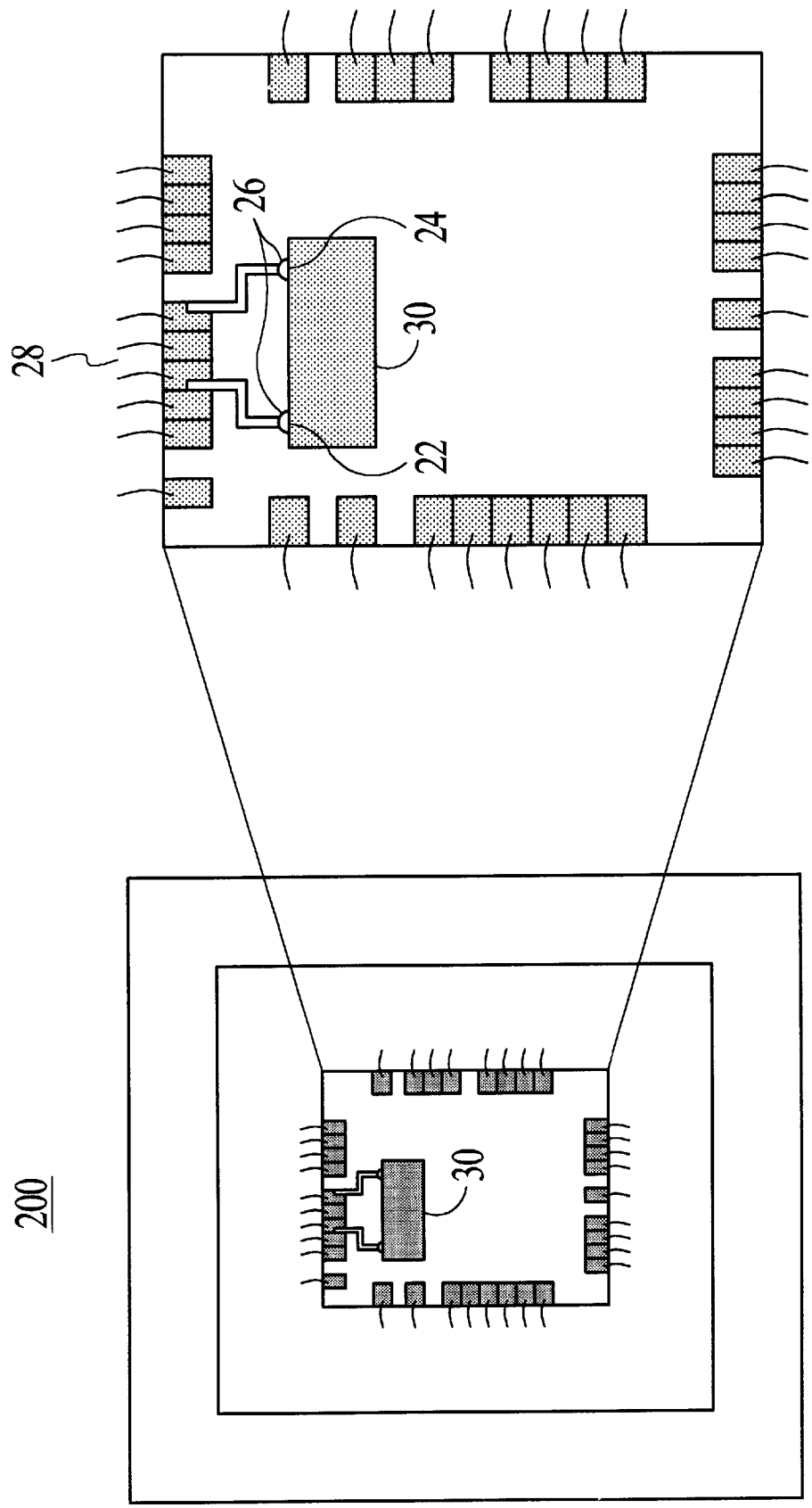
FIG. 6 is a top view illustrating the unit which comprises a capacitor attached to the conductive lines and electrically connected to the die in accordance with the present invention.
FIG. 7 is a zoom-in top view illustrating the die after attachment of a capacitor in accordance with the present invention.

FIGS. 6 and 7 illustrate how conductive lines 16 and 18 are spaced parallel and apart in a manner which is consistent with the connection ends 22 and 24 of the capacitor 30. After the deposited conductive lines 16 and 18 have been added to the die 10, the capacitor 30 is attached to the conductive lines 16 and 18. In a preferred embodiment of the present invention, an automatic attaching system (not shown), such as the ASMTEK or ZEVATECH, is used to attach the capacitor 30. In one embodiment, the conductive lines are deposited in a manner such that the end of the lines are parallel and apart with the distance of the connection ends 22 and 24 on the capacitor 30 which is around 1600 um.

The automatic attaching system places the solder paste 26, such as the brand made by HERAEUS with small particle size for better conductivity, at the ends of the conductive lines 16 and 18. The capacitor 30 is then attached to the solder paste on the conductive lines 16 and 18. FIG. 6 is a top view illustrating the unit 200 which comprises a device with an attached capacitor in accordance with the present invention. FIG. 7 is a zoom-in top view illustrating the attachment of the capacitor in accordance with the present invention.

In order to make a better electrical connection, the unit 200 comprising the device 100 with the attached capacitor 30, will proceed through a reflow process with peak temperature as high as 200 degrees Celsius. The reflow process will place the unit 200 on an automatically controlled belt which will proceed through a furnace (not shown). The furnace has a plurality of temperature zones and is capable of exposing the unit 200 to a temperature which gradually changes. A typical reflow temperature profile includes five temperature zones that are set at 190, 190, 200, 295, and 240 degrees C. A typical reflow temperature is set at 225 degrees C. In this embodiment, the reflow temperature is set lower, at 200 degrees C., in order to have less impact on device functionality. The solder paste 26 will melt during the reflow process and provide enhanced electrical connection, and the capacitor 30 becomes more solidly attached to the die surface having both of its connection ends 22 and 24 connect to the power supply pins 28 through the conductive lines 16 and 18 through the solder paste 26. The unit 200 may then be checked for various qualities including switching signal noise reduction.

In accordance with the present invention, a method and system for reducing switching signal noise by adding capacitors on IC devices is provided. As a result of the present invention, first hand information regarding the qualities, and condition of a device can be provided, a fact that is useful for a number of reasons, particularly, with regards to further design improvement of an IC device. Additionally, the present invention overcomes the problems associated with conventional methods which require the fabrication of the device such that an actual integrated capacitor is provided within the device, a process which is much more costly and time consuming.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A method for reducing switching noise on a device, the method comprising the steps of:

a) decapsulating the device, the device being a packaged integrated circuit device;

b) depositing at least one conductive line within the device; and c) attaching at least one capacitor to the at least one conductive line within the device.

2. The method of claim 1 wherein the packaged device comprises a Plastic Ball Grid Array package.

3. The method of claim 1 wherein the packaged device comprises a Fine Ball Grid Array package.

4. The method of claim 1 wherein the decapsulated device includes a silicon die, the silicon die having an open area, and at least one power supply bond pad, the at least one power supply bond pad having located therein at least one power supply pin for electrically connecting to the capacitor through the conductive line.

5. The method of claim 1, wherein the at least one conductive line has a resistance as low as 10 ohm per square.

6. The method of claim 1 wherein the depositing step a) further comprises utilizing a Focused Ion Beam (FIB) process to deposit the at least one conductive line.

7. The method of claim 4 wherein the conductive line is deposited on the silicon die extending from the power supply bond pad to the open area such that the conductive line is capable of providing a power supply voltage to the open area of the silicon die.

8. The method of claim 1 wherein the at least one line is deposited in a shape to attach to the at least one capacitor.

9. The method of claim 1 wherein the at least one capacitor has first and second connection ends, and wherein at least two conductive lines are deposited such that the ends of the at least two conductive lines are parallel and spaced apart to allow the first and second connection ends of the capacitor to be coupled thereto.

10. The method of claim 1, wherein the attaching step b) further comprises attaching the at least one capacitor utilizing an automatic system.

11. The method of claim 1, wherein the attaching step b) further comprises the steps of:
   b1) providing a solder paste at the end of the at least one conductive line; and
   b2) attaching the at least one capacitor to the solder paste on the conductive line.

12. The method of claim 1, wherein the attaching step b) further comprises the step of:
   b1) utilizing a reflow process for attaching the capacitor on the device.

13. The method of claim 12, wherein the reflow process further comprises the step b(1)(a) sending the device with the attached capacitor through a furnace, wherein the furnace includes a plurality of temperature zones.

14. A method for adding a capacitor to a device, comprising the steps of:
   a) decapsulating the device such that at least one silicon die is accessible;
   b) utilizing a Focused Ion Beam (FIB) for depositing at least one conductive line within the device; and
   c) utilizing an automatic system for attaching a capacitor to the at least one conductive line.

15. The method of claim 14 wherein the device comprises a packaged device.

16. The method of claim 14 wherein the at least one conductive line has a resistance as low as 10 ohm per square.

17. The method of claim 14, wherein the capacitor has a first and second connection end, and wherein at least two conductive lines are deposited such that the ends of the at least two conductive lines are parallel and spaced apart a distance which is equal to the distance between the first and second ends of the capacitor.

18. The method of claim 14, wherein the attaching step b) further comprises the steps of:
   b1) applying solder paste at the end of the at least one conductive line;
   b2) attaching the capacitor to the solder paste on the conductive line; and
   b3) utilizing a Reflow process for attaching the capacitor on the device providing an enhanced electrical connection.

19. A method of reducing switching noise for packaged devices comprising the steps of:
   a) providing at least one packaged integrated circuit device;
   b) decapsulating the at least one packaged integrated circuit device such that at least one silicon die is accessible, the at least one silicon die having at least one power supply bond pad, at least one power supply pin, and an open area;
   c) utilizing a Focused Ion Bearn (FIB) process for depositing at least one conductive line on the at least one integrated circuit device such that the at least one conductive line is capable of bringing VDD and ground power supplies to the open area of the integrated circuit device;
   d) attaching at least one capacitor to the decapsulated device, the attaching step d) comprising the steps of:
   d1) applying an amount of solder on the end of the at least one conductive line;
   d2) placing the capacitor onto the solder in order to electrically couple the capacitor to the power supply pin via the conductive line through the solder;
   d3) sending the decapsulated device-capacitor unit through a Reflow process; and
   e) checking the device-capacitor unit for the level of switching noise.

20. A system for reducing switching noise on a device, the system comprising:
   means for decapsulating the device;
   means for depositing at least one conductive line within the device; and
   means for attaching at least one capacitor to the at least one conductive line within the device.

21. The system of claim 20 wherein the device comprises an integrated circuit.

22. The system of claim 20 wherein the device comprises a packaged device.

23. The system of claim 20 wherein the packaged device comprises a Plastic Ball Grid Array package.

24. The system of claim 20 wherein the packaged device comprises a Fine Ball Grid Array package.

25. The system of claim 20 wherein the decapsulated device includes a silicon die, the silicon die having an open area, and at least one power supply bond pad, the at least one power supply bond pad having located therein at least one power supply pin for electrically connecting to the capacitor through the conductive line.

26. The system of claim 20, wherein the at least one conductive line has a resistance as low as 10 ohm per square.

27. The system of claim 20 wherein the depositing means comprises means for utilizing a Focused Ion Beam (FIB) process to deposit the at least one conductive line.

28. The system of claim 27 wherein the conductive line is deposited on the silicon die extending from the power supply bond pad to the open area such that the conductive line is capable of providing a power supply voltage to the open area of the silicon die.

29. The system of claim 20 wherein the at least one line is deposited in a shape to attach to the at least one capacitor.

30. The system of claim 20 wherein the at least one capacitor has first and second connection ends, and wherein at least two conductive lines are deposited such that the ends of the at least two conductive lines are parallel and spaced apart to allow the first and second connection ends of the capacitor to be coupled thereto.

31. The system of claim 20, wherein the attaching means further comprises an automatic attaching means.

* * * * *